United States Patent [19]
Li et al.

[11] Patent Number: 6,156,674
[45] Date of Patent: Dec. 5, 2000

[54] SEMICONDUCTOR PROCESSING METHODS OF FORMING INSULATIVE MATERIALS

[75] Inventors: Weimin Li; Zhiping Yin, both of Boise, Id.

[73] Assignee: Micron Technology, Inc., Boise, Id.

[21] Appl. No.: 09/200,035

[22] Filed: Nov. 25, 1998

[51] Int. Cl.$^7$ .................................................. H01L 21/469
[52] U.S. Cl. ........................................... 438/780; 438/255
[58] Field of Search ..................................... 438/763, 255, 438/579, 788, 715, 780; 556/10; 357/19, 17, 2, 32; 427/13, 54, 572, 719, 723; 430/57, 60, 84

[56] References Cited

U.S. PATENT DOCUMENTS

| | | | |
|---|---|---|---|
| 4,474,975 | 10/1984 | Clemons et al. | 556/410 |
| 4,600,671 | 7/1986 | Saitoh et al. | 430/69 |
| 4,695,859 | 9/1987 | Guha et al. | 357/19 |
| 5,061,509 | 10/1991 | Naito et al. | 427/13 |
| 5,356,515 | 10/1994 | Tahara et al. | 438/715 |
| 5,536,857 | 7/1996 | Narula | 556/10 |
| 5,661,093 | 8/1997 | Ravi et al. | 438/763 |
| 5,753,320 | 5/1998 | Mikoshiba et al. | 427/572 |

OTHER PUBLICATIONS

Matsuura, M., et al., "A Highly Reliable Self–planarizing Low–k Intermetal Dielectric for Sub–quarter Interconnects", *IEEE* Jul. 1997, pp. 785–788.

Horie, O., et al., "Kinetics and Mechanism of the Reactions of O($^3$P) with $SiH_4$, $CH_3SiH_3$, $(CH_3)_2SiH_2$, and $(CH_3)_3SiH$", *J. Phys. Chem. 1991*, vol. 95, pp. 4393–4400.

Withnall, R., et al., "Matrix Reactions of Methylsilanes and Oxygen Atoms", *J. Phys. Chem. 1988*, vol. 92, pp. 594–602.

Joshi, A., et al., "Plasma Deposited Organosilicon Hydride Network Polymers as Versatile Resists for Entirely Dry Mid–Deep UV Photolithography", *SPIE* vol. 1925, Jan. 1993, pp. 709–720.

*Primary Examiner*—David Nelms
*Assistant Examiner*—Phuc T. Dang
*Attorney, Agent, or Firm*—Wells, St. John, Roberts, Gregory & Matkin, P.S.

[57] ABSTRACT

In one aspect, the invention encompasses a semiconductor processing method wherein a first gaseous precursor compound is combined with a second gaseous precursor compound to form a material comprising carbon, silicon and oxygen. A layer of the material is formed over a semiconductive substrate. In another aspect, the invention encompasses another semiconductor processing method. Methylsilane is combined with a form of oxygen other than $H_2O_2$ to form an insulative compound comprising silicon bound to $CH_3$ groups and oxygen. A layer of the insulative compound is formed over a semiconductive substrate. In yet another aspect, the invention encompasses yet another semiconductor processing method. Methylsilane is subjected to a plasma treatment to form a layer over a semiconductive substrate, the layer comprises silicon bound to $CH_3$ groups. The layer is exposed to oxygen to convert the layer to an insulative compound comprising silicon bound to oxygen as well as the $CH_3$ groups.

50 Claims, No Drawings

SEMICONDUCTOR PROCESSING METHODS OF FORMING INSULATIVE MATERIALS

TECHNICAL FIELD

The invention pertains to semiconductor processing methods of forming and utilizing insulative materials.

BACKGROUND OF THE INVENTION

In methods of forming integrated circuits, it is frequently desired to electrically isolate components of the integrated circuits from one another with an insulative material. For example, conductive layers can be electrically isolated from one another by separating them with an insulative material. Also, devices which extend into a semiconductive substrate can be electrically isolated from one another by insulative materials formed within the substrate and between the components, such as, for example, trench isolation regions.

A suitable insulative material for isolating components of integrated circuits is silicon dioxide, which has a dielectric constant of about 4. In some applications, it is desired to utilize insulative materials having dielectric constants lower than that of silicon dioxide to reduce parasitic capacitance from occurring between conductive components separated by the insulative material.

A recently developed technique of forming silicon dioxide is a Flowfill™ technology, which has been developed by Trikon Technology of Bristol, U.K. In such process, $SiH_4$ (in a gaseous form) and $H_2O_2$ (in a liquid form) are separately introduced into a chamber, such as a parallel plate reaction chamber. A reaction between $SiH_4$ and $H_2O_2$ can be moderated by introduction of nitrogen into the reaction chamber. s A wafer is provided within the chamber, and ideally maintained at a suitably low temperature, such as 0° C., at an exemplary pressure of 1 Torr to achieve formation of a silanol-type structure of the formula $Si(OH)x$, which is predominantly $Si(OH)_4$. The $Si(OH)_4$ condenses on the wafer surface. Although the reaction occurs in the gas phase, the deposited $Si(OH)_4$ is in the form of a viscous liquid which flows to fill small gaps on the wafer surface. In applications where deposition thickness increases, surface tension drives the deposited layer flat, thus forming a planarized layer over the substrate.

The liquid $Si(OH)_4$ is converted to a silicon dioxide structure by a two-step process occurring in two separate chambers from that in which the silanol-type structure was deposited. First, planarization of the liquid film is promoted by increasing the temperature to above 100° C., while maintaining the pressure at about 1 Torr, to result in solidification and formation of a polymer layer. Thereafter, the temperature is raised to approximately 450° C., while maintaining the pressure of about 1 Torr, to form $SiO_2$. The processing at 450° C. also provides an advantage of driving undesired water from the resultant $SiO_2$ layer. Flowfill™ technology has also been utilized to form insulative materials comprising $(CH_3)_y SiO_{(2-y)}$, wherein y/2 is the percentage of $CH_3$ incorporated. Specifically, methylsilane is utilized in place of silane in the above-described reaction with hydrogen peroxide, and forms methylsilanol. The methylsilanol is a viscous liquid which flows over a substrate to fill gaps. Subsequently, the methylsilanol is treated with energy (such as heat) to drive water from the methylsilanol and form $(CH_3)_y SiO_{(2-y)}$. The $(CH_3)_y SiO_{(2-y)}$ has a dielectric constant of less than or equal to about 3, and is accordingly less likely to be involved in parasitic capacitance than is silicon dioxide. It would be desirable to develop alternative methods of forming insulative materials.

SUMMARY OF THE INVENTION

In one aspect, the invention encompasses a semiconductor processing method wherein a first gaseous precursor compound is combined with a second gaseous precursor compound to form a material comprising carbon, silicon and oxygen. A layer of the material is formed over a semiconductive substrate.

In another aspect, the invention encompasses another semiconductor processing method. Methylsilane is combined with a form of oxygen other than $H_2O_2$ to form an insulative compound comprising silicon bound to $CH_3$ groups and oxygen. A layer of the insulative compound is formed over a semiconductive substrate.

In yet another aspect, the invention encompasses a semiconductor processing method wherein a gaseous precursor compound is subjected to a plasma treatment to form a layer of first compound over a semiconductive substrate. The gaseous precursor compound comprises carbon and silicon, and the first compound comprises carbon and silicon. The layer is exposed to oxygen to convert the first compound to a second compound comprising silicon, carbon and oxygen.

In yet another aspect, the invention encompasses yet another semiconductor processing method. Methylsilane is subjected to a plasma treatment to form a layer over a semiconductive substrate, the layer comprises silicon bound to $CH_3$ groups. The layer is exposed to oxygen to convert the layer to an insulative compound comprising silicon bound to oxygen as well as to the $CH_3$ groups.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses methods of forming insulative materials, such as materials comprising carbon, silicon and oxygen. In one aspect of the invention, a first gaseous precursor compound comprising carbon and silicon is combined with a second gaseous precursor compound comprising oxygen to form a second compound comprising carbon, silicon and oxygen. The first compound can comprise, for example, $(CH_3)_y SiH_{(x)}$, wherein y is an integer of from 1 to 4 and x is an integer from 0 to 3. The second precursor compound is an oxygen-containing moiety that is preferably a "dry" compound (i.e., a compound that does not either contain water or decompose to form water), and can comprise, for example, $O_3$, $N_2O$, or activated oxygen species (e.g., highenergy $O_2$, monoatomic oxygen, or oxygen radicals). In contrast to the prior art methods discussed above in the "Background" section of this disclosure, water is preferably avoided in reactions of the present invention to avoid formation of silanol materials (such as silanol itself or methylsilanol). In one aspect of the invention, the oxygen-containing moiety is generated by exposing $O_2$ to ultraviolet light (a process which can generate, for example, activated oxygen species and $O_3$). In another aspect, the oxygen-containing moiety is generated by exposing an oxygen-containing gas (e.g., $O_3$, $O_2$, $N_2O$, CO or $CO_2$) to a plasma. The plasma can be within the reaction chamber, or remote from the chamber (i.e, not in the chamber).

In another aspect of the invention, a compound comprising silicon, carbon and oxygen is formed by reaction of $SiH_4$ with an organic compound comprising oxygen (e.g., CO or $CO_2$).

In an exemplary method of the present invention, methylsilane (also referred to herein as $CH_3SiH_3$ or $MeSiH_3$) is combined with $N_2O$ in a reaction chamber. A pressure within the chamber is maintained at from about 300 mTorr to about 30 Torr, and is preferably maintained at from about 1 Torr to about 10 Torr. The exemplary reaction chamber comprises a space of from about 400 mil to about 600 mil, and methylsilane is flowed into the chamber at a rate from about 25 standard cubic centimeters per minute (sccm) to about 2000 sccm (preferably at from about 50 sccm to about 100 sccm. The $N_2O$ is flowed into the reaction chamber at a rate from about 50 sccm to about 3000 sccm (preferably at a rate of from about 100 sccm to about 600 sccm, and more preferably at a rate of from about 200 sccm to about 400 sccm), and, additionally, helium is flowed into the reaction chamber at a rate of from about 500 sccm to about 5000 sccm (preferably from about 1000 sccm to about 3000 sccm). A radio frequency (RF) power within the chamber is maintained at from about 50 watts to about 500 watts, and preferably from about 100 watts to about 200 watts. A semiconductive substrate (such as a monocrystalline silicon wafer) is provided within the chamber and maintained at a temperature from about 80° C. to about 450° C. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The above-described processing forms $(CH_3)_y SiO_{(2-y)}$ over a substrate, and, in contrast to the prior art methods discussed above in the "Background" section, utilizes only a single reaction chamber. The concentration of methyl groups within the $(CH_3)_y SiO_{(2-y)}$ is typically from about 10% to about 15% (mole percent), i.e., y=from about 0.2 to about 0.3. In other embodiments of the invention, y can be from about 0.1 to about 1, i.e., the concentration of methyl groups can be from about 5% to about 50% (mole percent). In particular embodiments of the invention, a plasma can be generated within the chamber at an RF power of from about 50 watts to about 500 watts (preferably from about 80 watts to about 200 watts).

In a second aspect of the invention, a gaseous precursor compound is introduced into a reaction chamber and subjected to a plasma treatment. A semiconductive substrate is also provided in the reaction chamber, and a material comprising carbon and silicon is deposited from the plasma-treated precursor compound to over the substrate. After the material is deposited, it is exposed to an oxygen-containing moiety and converted to a second material comprising silicon, carbon and oxygen.

In an exemplary embodiment of the second aspect of the invention, methylsilane is flowed into a reaction chamber at a pressure of from about 300 mTorr to about 30 Torr (preferably from about 1 Torr to about 10 Torr) and subjected to a plasma formed at a power of from about 50 watts to about 500 watts (preferably from about 100 watts to about 200 watts). A semiconductive substrate is provided in the reaction chamber and maintained at a temperature of from about 0° C. to about 600° C. The plasma treated methylsilane deposits a material comprising methyl groups and silicon over the substrate. The deposited material is then exposed to an oxygen-containing moiety to convert the material to $(CH_3)_y SiO_{(2-y)}$. The oxygen-containing moiety is preferably in gaseous form, and can comprise, for example, ozone, $O_2$ or $N_2O$. In particular embodiments, the oxygen-containing moiety is subjected to plasma, heat or ultraviolet light. The oxygen treatment can occur at a pressure of from about 300 mTorr to about 1 atmosphere, with the deposited material maintained at a temperature of from about 0° C. to about 600° C. during the oxygen treatment.

The above-described methods of the present invention can be advantageous over prior art methods for forming insulative materials comprising $(CH_3)_y SiO_{(2-y)}$. Specifically, whereas prior art methods first form methylsilanol over a substrate and subsequently convert the methylsilanol to $(CH_3)_y SiO_{(2-y)}$, methods of the present invention avoid formation of silanol derivatives. Accordingly, processes of the present invention can save processing steps relative to the prior art processes described in the "Background" section of this disclosure. Further, the methylsilanol formed by prior art processes can cause corrosion of metal-comprising materials on a semiconductive substrate if the methylsilanol contacts such materials. Additionally, water released from the methylsilanol can further cause corrosion of metal-comprising components. Methods of the present invention eliminate formation of methylsilanol, and can thereby avoid corrosion problems instigated by either methylsilanol itself or water released from methylsilanol. Another advantage of methods of the present invention relative to prior art methods discussed in the "Background" section, is that methods of the present invention form $(CH_3)_y SiO_{(2-y)}$ from gaseous precursors, rather than from a gaseous precursor in combination with a liquid precursor. It can be easier to control flow rates and reaction parameters of gaseous precursors than of liquid precursors. Accordingly, methods of the present invention can enable better control of reaction rates than prior methods.

It is emphasized that the above-described exemplary embodiments of the present invention are provided for example purposes only, and are not intended to limit the claims except to the extent specifically recited within the claims. For instance, the exemplary processes described above generally pertain to formation of $(CH_3)_y SiO_{(4-y)}$. However, methods of the present invention are generally applicable to formation of compounds comprising silicon and oxygen, such as, for example, R—Si—O, wherein R is an organic material. The organic material indicated as R can be, for example, a hydrocarbon group (such as, for example, methyl, ethyl, propyl or butyl), and is preferably bound to the Si through a carbon-silicon bond.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:
    combining a first gaseous precursor compound with a second gaseous precursor compound to form a material comprising carbon, silicon and oxygen; the first precursor compound being $SiH_4$ and the second precursor being an organic compound comprising oxygen; and
    forming a layer of the material over a semiconductive substrate.

2. The method of claim 1 wherein the second precursor compound is selected from the group consisting of one or more of $O_3$, $O_2$ and $N_2O$.

3. A semiconductor processing method, comprising:
   combining a first gaseous precursor compound with a second gaseous precursor compound to form a material comprising carbon, silicon and oxygen;
   forming a layer of the material over a semiconductive substrate; and
   wherein the first precursor compound consists essentially of carbon, hydrogen and silicon; wherein the second precursor compound comprises oxygen; and wherein the material consists essentially of carbon, hydrogen, silicon and oxygen.

4. The method of claim 3 wherein the second precursor compound is selected from the group consisting of one or more of 03, $O_2$ and $N_2O$.

5. The method of claim 3 wherein the material comprises $(CH_3)_y SiO_{(2-y)}$.

6. The method of claim 3 wherein the material consists essentially of $(CH_3)_y SiO_{(2-y)}$.

7. The method of claim 3 wherein:
   the first precursor compound consists essentially of $(CH_3)_y SiH_x$, wherein y is from 1 to 4 and x is from 0 to 3;
   the second precursor compound is selected from the group consisting of one or more of $O_3$, $O_2$ and $N_2O$; and
   the material consists essentially of $(CH_3)_y SiO_{(2-y)}$.

8. A semiconductor processing method, comprising:
   combining a first compound with an oxygen-containing moiety to form a second compound; the oxygen-containing moiety not being $H_2O_2$, the first compound comprising carbon and silicon; the second compound comprising carbon, silicon and oxygen; and
   forming a layer of the second compound over a semiconductive substrate.

9. The method of claim 8 wherein the first compound consists essentially of carbon, hydrogen and silicon, and wherein the second compound consists essentially of carbon, hydrogen, silicon and oxygen.

10. The method of claim 8 wherein the oxygen-containing moiety is generated by exposing at least one of $O_3$, $O_2$ or $N_2O$ to plasma.

11. The method of claim 8 wherein the oxygen-containing moiety comprises at least one of $O_3$, $O_2$ or $N_2O$.

12. The method of claim 8 wherein the oxygen-containing moiety is generated by exposing $O_2$ or $O_3$ to ultraviolet light.

13. The method of claim 8 wherein the oxygen-containing moiety is $N_2O$, wherein the first compound comprises $(CH_3)_y SiH_x$, wherein y is from 1 to 4 and x is from 0 to 3, and wherein the combining comprises:
   flowing the $N_2O$ and $(CH_3)_y SiH_x$ into a reaction chamber; and
   mixing the $N_2O$ and $(CH_3)_y SiH_x$ within the reaction chamber.

14. The method of claim 8 wherein the majority of the carbon present in the second compound is in the form of methyl groups, and wherein the methyl groups comprise from 10% to about 15% of the second compound (mole percent).

15. The method of claim 8 wherein substantially all of the carbon present in the second compound is in the form of methyl groups, and wherein the methyl groups comprise from 5% to about 50% of the second compound (mole percent).

16. The method of claim 8 wherein the carbon present in the first and second compounds is in the form of hydrocarbon groups.

17. The method of claim 8 wherein the combining occurs in a reactor and with a pressure within the reactor being at from about 300 mTorr to about 30 Torr during the combining and forming.

18. The method of claim 8 wherein the combining occurs in a reactor and simultaneously with the forming; a pressure within the reactor being greater than 0 Torr and no greater than about 1 atmosphere during the combining and forming.

19. The method of claim 8 wherein the combining occurs in a reactor and with a pressure within the reactor at from about 1 mTorr to about 10 Torr.

20. The method of claim 8 further comprising exposing a gaseous precursor of the first compound to a plasma to form the first compound.

21. The method of claim 8 further comprising:
   exposing a gaseous precursor of the first compound to a plasma to form a layer of the first compound over the substrate; and
   the combining comprising exposing the layer of the first compound to oxygen.

22. The method of claim 8 wherein the second compound comprises $(CH_3)_y SiO_{(2-y)}$.

23. The method of claim 10 wherein the second compound consists essentially of $(CH_3)_y SiO_{(2-y)}$.

24. A semiconductor processing method, comprising:
   combining a first gaseous compound with an oxygen-containing moiety to form a second compound; the oxygen-containing moiety being selected from the group consisting of $O_3$, $O_2$ and $N_2O$, the first compound comprising carbon and silicon; the second compound comprising carbon, silicon and oxygen; and
   forming a layer of the second compound over a semiconductive substrate.

25. The method of claim 24 wherein the first compound consists essentially of carbon, hydrogen and silicon, and wherein the second compound consists essentially of carbon, hydrogen, silicon and oxygen.

26. A semiconductor processing method, comprising:
   combining methylsilane with a form of oxygen other than $H_2O_2$ to form an insulative compound comprising silicon bound to methyl groups and oxygen; and
   forming a layer of the insulative compound over a semiconductive substrate.

27. The method of claim 26 wherein the oxygen is in the form of $O_3$, $O_2$ or $N_2O$.

28. The method of claim 26 wherein the oxygen is generated by exposing $O_2$ to ultraviolet light.

29. The method of claim 26 wherein the oxygen is in the form of $N_2O$ and wherein the combining comprises:
   flowing the $N_2O$ and methylsilane into a reaction chamber; and
   mixing the $N_2O$ and methylsilane within the reaction chamber; a pressure within the reaction chamber being maintained at from about 300 mTorr to about 30 Torr during the mixing.

30. The method of claim 26 wherein the methyl groups within the insulative compound comprise from 5% to about 50% of the insulative compound (mole percent).

31. The method of claim 26 wherein the combining occurs in a reactor and with a pressure within the reactor at from about 1 Torr to about 10 Torr.

32. The method of claim 26 wherein the combining occurs in a reactor and simultaneously with the forming; a pressure within the reactor being at from about 1 Torr to about 10 Torr during the combining and forming.

33. The method of claim 26 wherein the combining occurs in a reactor and with a pressure within the reactor at from about 300 mTorr to about 10 Torr.

34. A semiconductor processing method, comprising:
   subjecting a gaseous precursor compound to a plasma treatment to form a layer of first compound over a semiconductive substrate, the gaseous precursor compound comprising carbon and silicon, and the first compound comprising carbon and silicon; and
   exposing the layer to oxygen to convert the first compound to a second compound comprising silicon, carbon and oxygen.

35. The method of claim 34 wherein the compound consists essentially of carbon, hydrogen and silicon, and wherein the second compound consists essentially of carbon, hydrogen, silicon and oxygen.

36. The method of claim 34 wherein the oxygen is in the form of $O_3$, $O_2$ or $N_2O$.

37. The method of claim 34 wherein the oxygen is generated by exposing one or more of $O_3$, $N_2O$ and $O_2$ to ultraviolet light.

38. The method of claim 34 wherein the oxygen is generated by exposing one or more of $O_3$, $N_2O$ and $O_2$ to a plasma.

39. The method of claim 34 wherein the gaseous precursor comprises $(CH_3)_y SiH_x$, wherein y is from 1 to 4 and x is from 0 to 3, and the first compound comprises carbon, hydrogen and silicon.

40. The method of claim 34 wherein the majority of the carbon present in the second compound is in the form of methyl groups, and wherein the methyl groups comprise from 10% to about 15% of the second compound (mole percent).

41. The method of claim 34 wherein substantially all of the by carbon present in the second compound is in the form of methyl groups, and wherein the methyl groups comprise from 10% to about 15% of the second compound (mole percent).

42. The method of claim 34 wherein the carbon present in the first and second compounds is in the form of hydrocarbon groups.

43. The method of claim 34 wherein the exposing occurs in a reactor and with a pressure within the reactor at greater than 0 Torr and no greater than about 1 atmosphere.

44. A semiconductor processing method, comprising:
   subjecting methylsilane to a plasma treatment to form a layer over a semiconductive substrate, the layer comprising silicon bound to $CH_3$ groups; and
   exposing the layer to oxygen to convert the layer to an insulative compound comprising silicon bound to oxygen as well as to the $CH_3$ groups.

45. The method of claim 44 wherein the exposing occurs after and in a separate discrete step from the subjecting.

46. The method of claim 44 wherein the oxygen is in the form of $O_3$, $O_2$ or $N_2O$.

47. The method of claim 44 wherein the oxygen is generated by exposing one or more of $O_3$, $O_2$ and $N_2O$ to ultraviolet light.

48. The method of claim 44 wherein the oxygen is generated by exposing one or more of $O_3$, $O_2$ and $N_2O$ to plasma.

49. The method of claim 44 wherein the methyl groups within the insulative compound comprise from about 10% to about 15% of the insulative compound (mole percent).

50. The method of claim 44 wherein the exposing occurs in a reactor and with a pressure within the reactor at greater than 0 Torr and no greater than about 1 atmosphere.

* * * * *

UNITED STATES PATENT AND TRADEMARK OFFICE
CERTIFICATE OF CORRECTION

PATENT NO : 6,156,674
DATED : December 5, 2000
INVENTOR(S) : Weimin Li et al.

It is certified that error appears in the above-identified patent and that said Letters Patent are hereby corrected as shown below:

Col. 5, line 17
  replace "03"
  with --$O_3$--.
Col. 6, line 22
  replace "10"
  with --8--.
Col. 7, line 31 please delete "by".

Signed and Sealed this

First Day of May, 2001

Attest:

NICHOLAS P. GODICI

Attesting Officer       Acting Director of the United States Patent and Trademark Office